(12) United States Patent
Wei et al.

(10) Patent No.: US 11,262,786 B1
(45) Date of Patent: Mar. 1, 2022

(54) DATA DELAY COMPENSATOR CIRCUIT

(71) Applicant: Silicon Laboratories Inc., Austin, TX (US)

(72) Inventors: Hegong Wei, Austin, TX (US); Brian Brunn, Austin, TX (US); Paul Zavalney, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/123,949

(22) Filed: Dec. 16, 2020

(51) Int. Cl.
  *G06F 1/12* (2006.01)
  *G06F 1/10* (2006.01)
  *H03K 5/135* (2006.01)

(52) U.S. Cl.
  CPC ............... *G06F 1/10* (2013.01); *G06F 1/12* (2013.01); *H03K 5/135* (2013.01)

(58) Field of Classification Search
  CPC .................................. G06F 1/12; H03K 5/135
  See application file for complete search history.

(56) References Cited

U.S. PATENT DOCUMENTS

| | | | | |
|---|---|---|---|---|
| 5,905,391 A * | 5/1999 | Mooney | .................. | H03K 5/135 327/161 |
| 6,225,840 B1 * | 5/2001 | Ishimi | ....................... | H03L 7/07 327/116 |
| 7,428,287 B2 * | 9/2008 | Holzle | .................. | H03L 7/0816 375/372 |
| 7,482,841 B1 * | 1/2009 | Nguyen | ............... | H03D 13/004 327/12 |
| 9,225,321 B2 * | 12/2015 | Bal | ........................ | H04L 7/0045 |
| 10,069,508 B1 * | 9/2018 | Zhang | .................. | H03M 1/662 |
| 2003/0102928 A1 * | 6/2003 | d'Haene | ................. | H04L 7/033 331/172 |
| 2007/0064781 A1 * | 3/2007 | Yamaguchi | ............... | G06F 1/10 375/221 |
| 2010/0001769 A1 * | 1/2010 | Brantley | ................... | H03L 7/10 327/144 |
| 2014/0347941 A1 * | 11/2014 | Jose | ........................ | H03L 7/093 365/191 |

* cited by examiner

*Primary Examiner* — Phil K Nguyen
(74) *Attorney, Agent, or Firm* — Nields, Lemack & Frame, LLC

(57) ABSTRACT

A circuit for compensating for data delay is disclosed. The circuit utilizes an internal clock signal. This internal clock signal passes through an I/O buffer to become an external clock. This external clock is then passed through the I/O buffer to create the return clock signal. This difference between the internal clock signal and the return clock signal is defined as I/O delay. In certain embodiments, this I/O delay may be more than one clock period, which typically causes incorrect operation of synchronous logic. The present circuit allows for a I/O delay of N clock periods, wherein N is greater than one, through a novel approach to capturing and synchronizing the return data. This allows high speed microcontrollers to utilize lower speed I/O buffers to reduce interference, or allows these microcontrollers to interface with slower external devices.

20 Claims, 10 Drawing Sheets

DATA DELAY COMPENSATOR CIRCUIT

This disclosure describes systems and methods for compensating for variable delays when receiving synchronous data.

BACKGROUND

Semiconductor components, such as microcontrollers (MCUs) often need to communicate with external devices, such as memory to load execution command codes or I/O devices. Due to environmental changes, such as temperature or supply variation, the loop back delay (transmit delay plus receive delay of I/O) can experience large variation that may lead to an uncertain time of data capture. Moreover, the number of devices driven by one I/O buffer can be different in different applications. This leads to a large load capacitance variation, which will also contribute to a large variation in loop back delay.

Thus, in order to achieve predictable communication, fast I/O buffers are typically employed to send or receive clock and data signals. However, in some embodiments, the semiconductor component may include a radio portion. If the radio portion of the MCU is required to run simultaneously, the high-speed I/O signals may cause interference that degrades the wireless communication quality.

On the other hand, if slow I/O buffers are implemented, the radio interference is reduced but a large loop back delay will result.

Many systems implement a system whereby the data to be transmitted and received is synchronized with the internal clock. FIG. 1 shows a typical circuit diagram used for this function.

Flip flop 10 receives data internal to the semiconductor component 1 that is to be transmitted externally. The flip flop 10 is clocked using the internal clock signal 11. This internal clock signal 11 may be any frequency, such as up to 100 MHz or more. The output of flip flop 10 is in communication with data out I/O buffer 12, which serves as the interface between the interior of the semiconductor component 1 and the exterior. The output of the data out I/O buffer 12 is referred to as the DATA_OUT signal. The internal clock signal 11 is also in communication with a clock I/O buffer 13 to generate an external clock signal. The output of the clock I/O buffer 13 is referred to as the CLOCK signal. Clock I/O buffer 13 serves as a transceiver in that the external clock signal (the CLOCK signal) is also an input, so as to create a return clock signal 14. Since the return clock signal 14 is generated based on the external clock signal (CLOCK), it includes the I/O delay associated with the CLOCK signal. The return data (DATA_IN signal) transmitted by the external device is essentially aligned with the CLOCK signal received by the external device 50. Typically, the delay associated with the other output signals, such as the DATA_OUT signal, is comparable to that associated with the external clock signal. The DATA_OUT signal and the CLOCK signal may serve as inputs to an external device 50.

External data from the external device 50 enters the semiconductor device 1 and passes through data in I/O buffer 15. The output of the data in I/O buffer 15 is referred to as return data 16. It is noted that the data may be bidirectional, such that data out I/O buffer 12 and data in I/O buffer 15 may be one single bidirectional buffer.

The return data 16 is the input to flip flop 17, which utilizes the return clock signal 14 as its clock. The output of flip flop 17, referred to as the Q return signal 18, is then used as to the input to flip flop 19. Flip flop 19 is clocked using internal clock signal 11. This flip flop 19 serves to synchronize the incoming data to the internal clock 11. The output of this flip flop 19 is referred to as the Q final signal 20.

This circuit, however, requires a small I/O delay. Specifically, FIG. 2A shows a timing diagram illustrating the operation of the circuit shown in FIG. 1. In this figure, the I/O delay, which is the difference in time between the internal clock signal 11 and the return clock signal 14, is small, such as less than 1 clock period. In this timing diagram, it is assumed that the DATA_IN signal (and therefore the return data 16) is aligned with the negative edge of return clock signal 14. Thus, regardless of the I/O delay, the Q return signal 18, which corresponds to the DATA_IN signal, is output by flip flop 17 on the following rising edge of the return clock signal 14. This is because the return data 16 is synchronized to the return clock signal 14. Since the I/O delay is less than 1 period, the Q final signal 20 is generated by the third rising edge of the internal clock signal 11. Thus, as shown in FIG. 2A, there is a two clock period delay between the rising edge of the internal clock signal 11 that resulted in the generation of the DATA_IN signal and the corresponding Q final signal 20.

However, FIG. 2B shows an I/O delay that is greater than one clock period. As before, the Q return signal 18, which corresponds to the DATA_IN, is output from flip flop 17 on the following return clock signal 14. However, since the I/O delay is more than 1 period, the Q final signal 20 is generated by the fourth rising edge of internal clock signal 11. As shown in FIG. 2B, there is a three clock period delay between the rising edge of the internal clock signal 11 that resulted in the generation of the DATA_IN signal and the corresponding Q final signal 20.

In other words, the time at which a valid Q final signal 20 is present varies depending on the I/O delay. This ambiguity is unacceptable, as it will create incorrect processing further downstream.

Therefore, it would be advantageous if there were a method and system of synchronously receiving inputs to a semiconductor device which are tolerant of I/O delays greater than one clock period. Further, it would be advantageous if the I/O delay could be two clock periods or larger.

SUMMARY

A circuit for compensating for data delay is disclosed. The circuit utilizes an internal clock signal. This internal clock signal passes through an I/O buffer to become an external clock. This external clock is then passed through the I/O buffer to create the return clock signal. This difference between the internal clock signal and the return clock signal is defined as I/O delay. In certain embodiments, this I/O delay may be more than one clock period, which typically causes incorrect operation of synchronous logic. The present circuit allows for a I/O delay between 0 and N clock periods, wherein N is greater than one, through a novel approach to capturing and synchronizing the return data. This allows high speed microcontrollers to utilize lower speed I/O buffers to reduce interference, save power/area budget, or allows these microcontrollers to interface with slower external devices.

According to one embodiment, data delay compensation circuit for use within a semiconductor device is disclosed. The data delay compensation circuit comprises an I/O buffer to provide return data from an external device to an interior of the semiconductor device; a clock I/O buffer circuit to supply an internal clock signal to an exterior of the semiconductor device and provide a return clock signal to the interior of the semiconductor device; a return data capture stage, comprising: a plurality of capture flip flops which are clocked using the return clock signal, wherein the plurality is N, wherein each capture flip flop receives updated return data every Nth clock; a return data synchronization stage, comprising: N synchronization flip flops which are clocked using the internal clock signal, wherein each synchronization flip flop receives updated data from a corresponding capture flip flop every Nth clock; a multiplexer to select an output from one of the N synchronization flip flops; and a final flip flop, which is clocked using the internal clock signal and receives the output from the multiplexer as an input. In certain embodiments, the return data capture stage comprises a capture selector circuit to uniquely select one of the N capture flip flops, wherein the capture selector circuit is clocked by the return clock signal. In certain further embodiments, the capture selector circuit comprises a counter. In certain further embodiments, the capture selector circuit comprises a shift register. In some embodiments, the return data capture stage comprises a demultiplexer, having an input, a plurality of outputs and one or more select signals, wherein the input to the demultiplexer comprises the return clock signal, the select signals comprise an output of the capture selector circuit and each output is in communication with a clock input of a respective capture flip flop. In some embodiments, the return data capture stage comprises N multiplexers, an output of each in communication with an input of a respective capture flip flop, wherein each multiplexer selects between the return data and an output of the respective capture flip flop. In certain embodiments, the return data synchronization stage comprises a synchronization selector circuit to uniquely select one of the N synchronization flip flops, wherein the synchronization selector circuit is clocked by the internal clock signal. In certain further embodiments, the synchronization selector circuit comprises a counter. In certain further embodiments, the synchronization selector circuit comprises a shift register. In certain embodiments, the return data synchronization stage comprises a demultiplexer, having an input, a plurality of outputs and one or more select signals, wherein the input to the demultiplexer comprises the internal clock signal, the select signals comprise an output of the synchronization selector circuit and each output is in communication with a clock input of a respective synchronization flip flop. In certain embodiments, the return data capture stage comprises N multiplexers, an output of each in communication with an input of a respective synchronization flip flop, wherein each multiplexer selects between an output from a corresponding capture flip flop and an output of the respective synchronization flip flop. In certain embodiments, a difference in time between the internal clock signal and the return clock signal is defined as an I/O delay, and a time from a first pulse of the internal clock signal to a time at which an output from the final flip flop is valid is deterministic if the I/O delay is less than N clock periods. In certain embodiments, the semiconductor device operates in dual data rate mode, and wherein the clock I/O buffer circuit comprises a clock I/O buffer, a divide-by-two circuit to divide the internal clock signal by two prior to transmission by the clock I/O buffer, and a multiply-by-two circuit to multiply an internal output from the clock I/O buffer by two to create the return clock signal.

According to another embodiment, data delay compensation circuit for use within a semiconductor device is disclosed. The data delay compensation circuit comprises an I/O buffer to provide return data from an external device to an interior of the semiconductor device; a clock I/O buffer circuit to supply an internal clock signal to an exterior of the semiconductor device and provide a return clock signal to the interior of the semiconductor device; a return data capture stage, comprising: a capture divide-by-two circuit clocked using the return clock signal to create a toggle signal; a first capture flip flop and a second capture flip flop, which are clocked using the return clock signal, wherein each capture flip flop receives updated return data every other clock, based on a state of the toggle signal; a return data synchronization stage, comprising: a synchronization divide-by-two circuit clocked using the internal clock signal to create an internal clock/2 signal; a first synchronization flip flop and a second synchronization flip flop, which are clocked using the internal clock signal, wherein the first synchronization flip flop receives updated data from the first capture flip flop every other clock and wherein the second synchronization flip flop receives updated data from the second capture flip flop every other clock, based on a state of the internal clock/2 signal; a multiplexer to select an output from one of the first synchronization flip flop and the second synchronization flip flop based on the state of the internal clock/2 signal; and a final flip flop, which is clocked using the internal clock signal and receives the output from the multiplexer as an input. In certain embodiments, the return data capture stage comprises a demultiplexer, having an input, a select signal and two outputs, wherein the input to the demultiplexer is the return clock signal, the select signal is the toggle signal and a first of the two outputs is in communication with a clock signal of the first capture flip flop and a second of the two outputs is in communication with a clock signal of the second capture flip flop. In certain embodiments, the return data synchronization stage comprises a demultiplexer, having an input, a select signal and two outputs, wherein the input to the demultiplexer is the internal clock signal, the select signal is the internal clock/2 signal and a first of the two outputs is in communication with a clock signal of the first synchronization flip flop and a second of the two outputs is in communication with a clock signal of the second synchronization flip flop. In certain embodiments, the return data capture stage comprises a first multiplexer, having two inputs, a select signal and an output, wherein the inputs to the multiplexer comprise the return data and an output of the first capture flip flop, the select signal is the toggle signal and the output is in communication with an input of the first capture flip flop; and a second multiplexer, having two inputs, a select signal and an output, wherein the inputs to the multiplexer comprise the return data and an output of the second capture flip flop, the select signal is the toggle signal and the output is in communication with an input of the second capture flip flop. In certain embodiments, the return data synchronization stage comprises a first multiplexer, having two inputs, a select signal and an output, wherein the inputs to the multiplexer comprise the output of the first capture flip flop and an output of the first synchronization flip flop, the select signal is the internal clock/2 signal and the output is in communication with an input of the first synchronization flip flop; and a second multiplexer, having two inputs, a select signal and an output, wherein the inputs to the multiplexer comprise an output of the second capture flip flop and an output of the second synchronization flip flop, the select signal is the internal clock/2 signal and the output is in communication with an input of the second synchronization flip flop. In some embodiments, a difference in time between the internal clock signal and the return clock signal is defined as an I/O delay, and a time from a first pulse of the internal clock signal to a time at which an output from the final flip flop is valid is deterministic if the I/O delay is less than 2 clock periods. In certain embodiments, the return clock is generated based on the internal clock signal, the return data is generated based on an edge of the return clock, and a delay from an assertion of the internal clock signal to receipt of valid data at the output of the final flip flop is 4 clock periods. In certain embodiments, the semiconductor device operates in dual data rate mode, and wherein the clock I/O buffer circuit comprises a clock I/O buffer, a divide-by-two circuit to divide the internal clock signal by two prior to transmission by the clock I/O buffer, and a multiply-by-two circuit to multiply an internal output from the clock I/O buffer by two to create the return clock signal.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
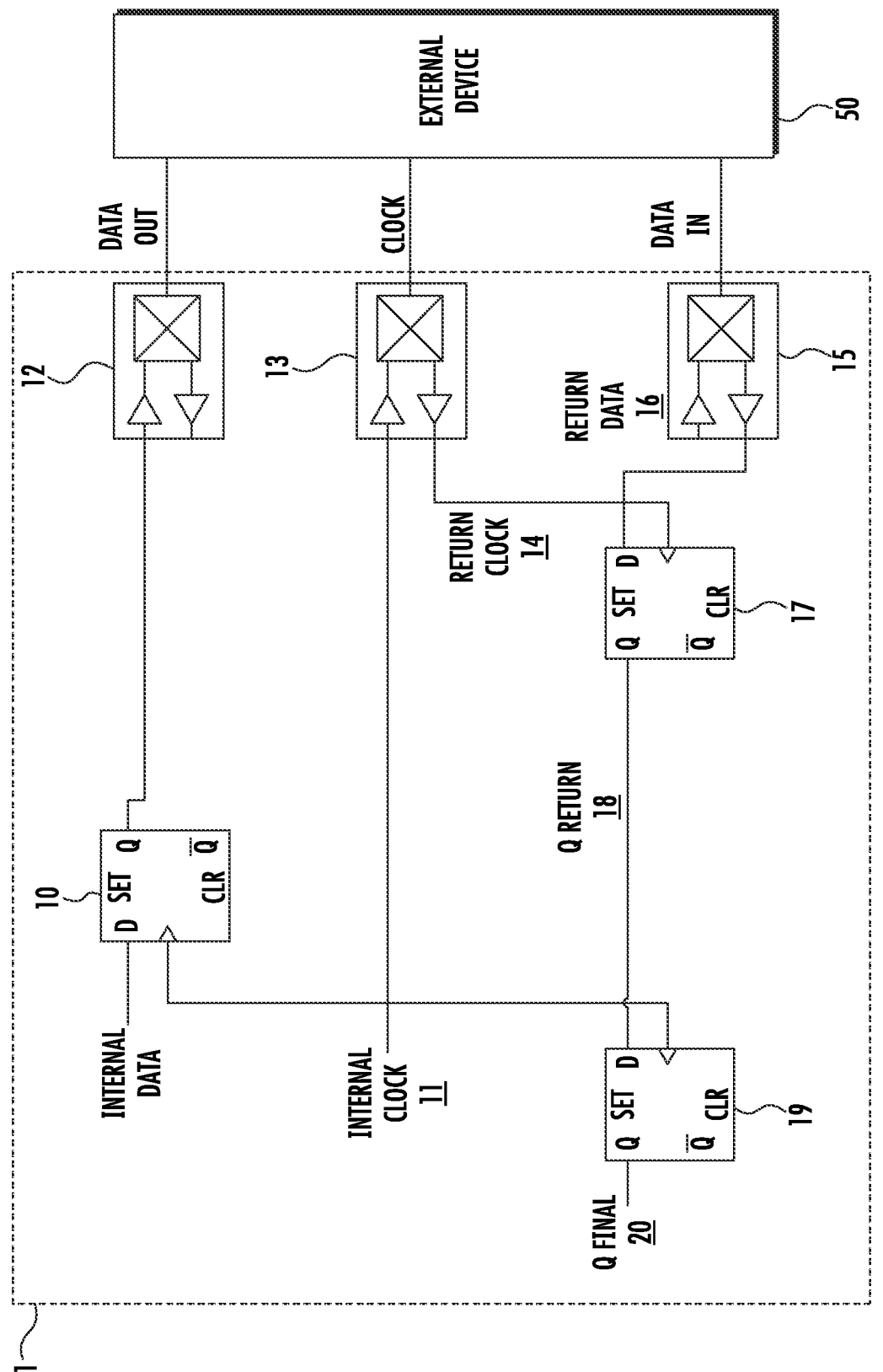
FIG. 1 is a circuit for receiving synchronous signals according to the prior art.
Figure 2A:
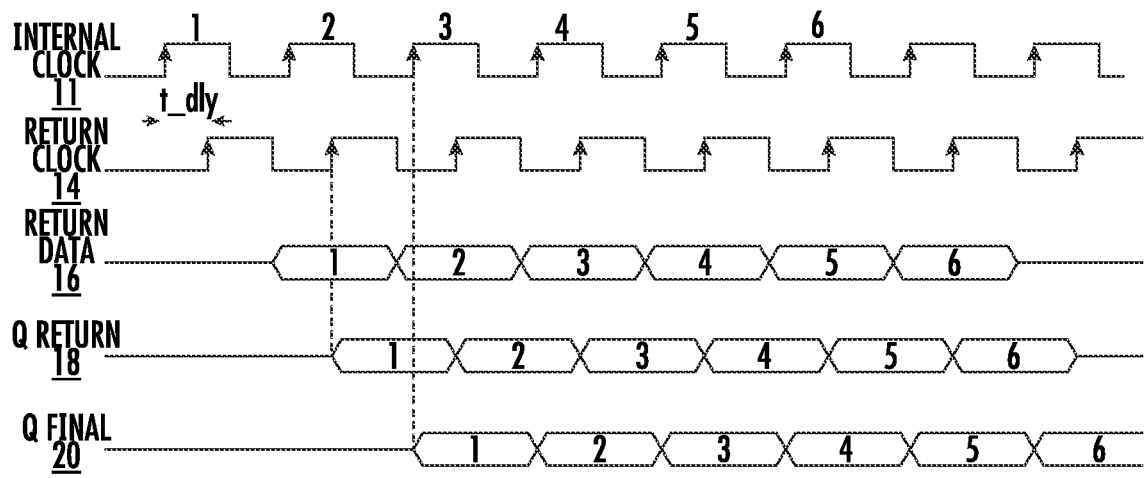
FIGS. 2A-2B are timing diagrams associated with the circuit of FIG. 1 for different I/O delays.
Figure 2B:
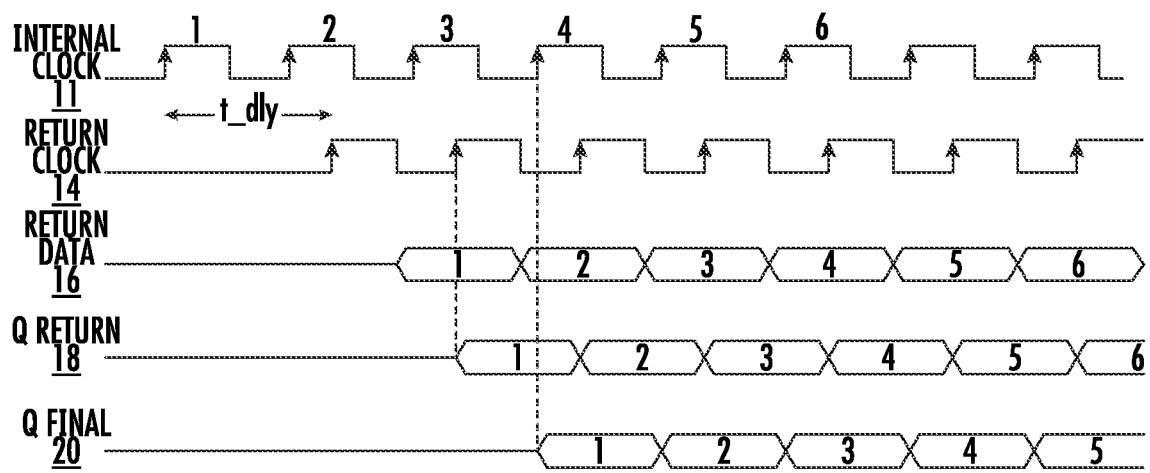
Figure 3:
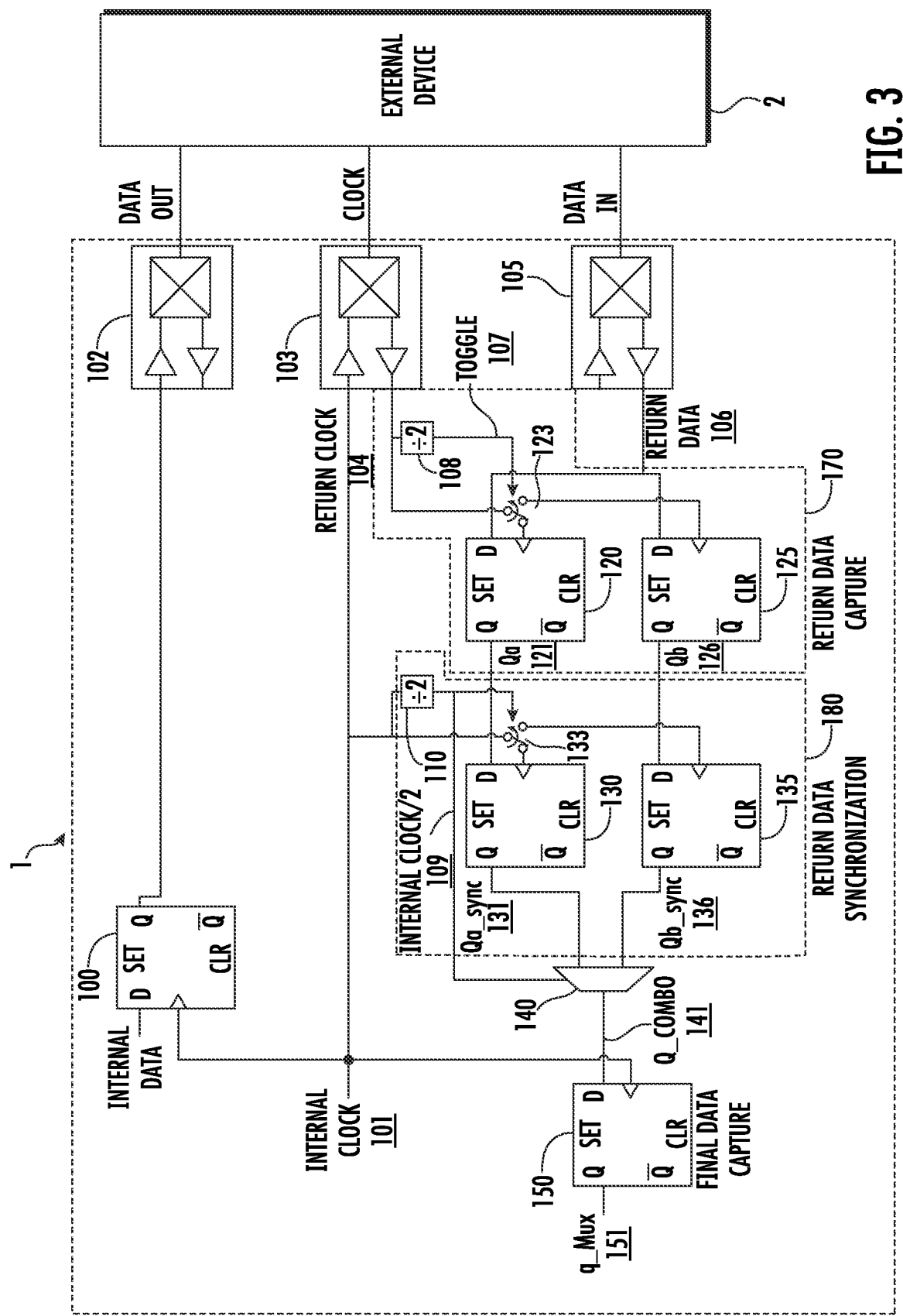
FIG. 3 is a circuit for receiving synchronous signals according to one embodiment.

FIG. 3 shows a representative circuit that may be used to provide a predictable data capture for various I/O delays. This circuit may be disposed within a semiconductor device 1, such as a microcontroller. In this disclosure, I/O delay is defined as the difference between the internal, or source, clock and the received clock. The circuit shown in the figure yields predictable results with I/O delays that can as large as two periods of the source clock.

Flip flop 100 receives data internal to the semiconductor device 1 that is to be transmitted externally. The flip flop 100 is clocked using the internal clock signal 101. This internal clock signal 101 may be any frequency, such as up to 100 MHz or more. The output of flip flop 100 is in communication with data out I/O buffer 102, which serves as the interface between the interior of the semiconductor device 1 and the exterior. The output of the data out I/O buffer 102 is referred to as the DATA_OUT signal. The internal clock signal 101 is also in communication with a clock I/O buffer 103 to generate an external clock signal. The output of the clock I/O buffer 103 is referred to as the CLOCK signal. Clock I/O buffer 103 serves as a transceiver in that the external clock signal (CLOCK) is also an input, so as to create a return clock signal 104. Since the return clock signal 104 is generated based on the external clock signal (CLOCK), it includes the I/O delay associated with the clock signal. Typically, the delay associated with the other output signals, such as DATA_OUT, is comparable to that associated with the external clock signal. The DATA_OUT signal and the CLOCK signal may serve as inputs to an external device 2.

External data from the external device 2 enters the semiconductor device 1 and passes through data in I/O buffer 105. The output of the data in I/O buffer 105 is referred to as return data 106. It is noted that the data may be bidirectional, such that data out I/O buffer 102 and data in I/O buffer 105 may be one single bidirectional buffer.

The return clock signal 104 is used as the input to a divide-by-2 circuit 108. The divide-by-2 circuit 108 may be a flip flop where the input to the flip flop is the Qbar output of the flip flop. Of course, the divide-by-2 circuit 108 may be implemented in other ways as well. The output of the divide-by-2 circuit 108 is referred to as the Toggle signal 107.

Similarly, the internal clock signal 101 is used as the input to a divide-by-2 circuit 110. The divide-by-2 circuit 110 may be a flip flop where the input to the flip flop is the Qbar output of the flip flop. Of course, the divide-by-2 circuit 110 may be implemented in other ways as well. The output of the divide-by-2 circuit 110 is referred to as the Internal Clock/2 signal 109.

The phase between the Internal Clock/2 signal 109 and the Toggle signal 107 is deterministic. In one embodiment, the Internal Clock/2 signal 109 is asserted by a particular rising edge of the Internal Clock signal 101. That same rising edge of the Internal Clock signal 101 is used to generate a rising edge of the return clock signal 104. This rising edge of the return clock signal 104 is then used to assert the Toggle signal 107. In other words, the same rising edge of the Internal Clock signal 101 is used to directly assert the Internal Clock/2 signal 109 and to indirectly assert the Toggle signal 107.

In this embodiment, there are two capture flip flops 120, 125 that are used to synchronize the incoming data (i.e. return data 106) to the return clock signal 104. These two capture flip flops 120, 125 and the divide-by-two circuit 108 form a first stage that may be referred to as the return data capture stage 170. Specifically, the Toggle signal 107 is used to select which of the two capture flip flops 120, 125 receives new data for each rising edge of the return clock signal 104. The outputs of the two capture flip flops 120, 125 are referred as the Qa signal 121 and Qb signal 126, respectively.

In one embodiment, the Toggle signal 107 is used as the select signal to a demultiplexer 123 that allows the return clock signal 104 to communicate with exactly one of the clock inputs of the two capture flip flops 120, 125. In this embodiment, the clock input of each capture flip flop 120, 125 is asserted at a frequency equal to that of the Toggle signal 107.

Figure 6A:
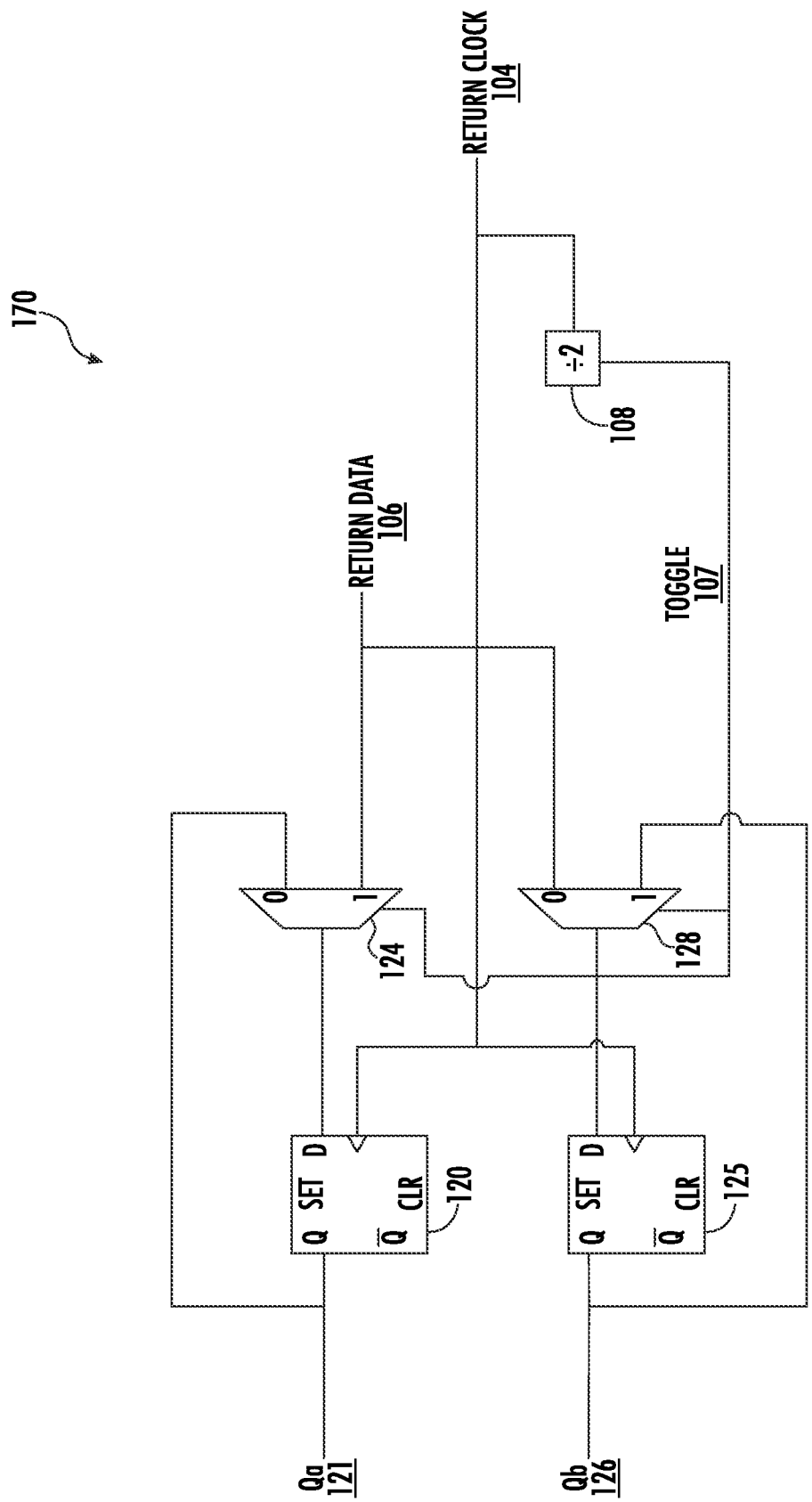
FIGS. 6A-6B show an alternate configuration for use with the circuits shown in FIGS. 3 and 5A-5B.

In another embodiment, shown in FIG. 6A, the return clock signal 104 is in communication with the clock inputs of the two capture flip flops 120, 125. In this embodiment, the Toggle signal 107 is used to select which of two inputs of a multiplexer 124, 128 is in communication with the D input of each of the two capture flip flops 120, 125. These two inputs may be the output of the respective capture flip flop and the return data 106. In this embodiment, the clock input of each capture flip flop 120, 125 is asserted at a frequency equal to that of the return clock signal 104, but the incoming data is updated at a frequency equal to that of the Toggle signal 107.

In this way, the output of the capture flip flop 120 (i.e. the Qa signal 121) updates each time the return clock signal 104 is asserted while the Toggle signal 107 is asserted. The output of the capture flip flop 125 (i.e. the Qb signal 126) updates each time the return clock signal 104 is asserted while the Toggle signal 107 is deasserted. In this way, incoming data is alternatively captured by the two capture flip flops 120, 125.

Referring again to FIG. 3, the outputs of the return data capture stage 170 are used as the inputs to the return data synchronization stage 180. The return data synchronization stage 180 comprises two synchronization flip flops 130, 135 and a divide-by-two circuit 110.

Specifically, the Internal Clock/2 signal 109 is used to select which of the two synchronization flip flops 130, 135 receives new data for each rising edge of the Internal Clock signal 101. The outputs of the two synchronization flip flops 130, 135 are referred as the Qa_sync signal 131 and Qb_sync signal 136, respectively.

In one embodiment, the Internal Clock/2 signal 109 is used as the select signal to a demultiplexer 133 that allows the Internal Clock signal 101 to communicate with exactly one of the clock inputs of the two synchronization flip flops 130, 135. In this embodiment, the clock input of each synchronization flip flop 130, 135 is asserted at a frequency equal to that of the Internal Clock/2 signal 109.

Figure 6B:
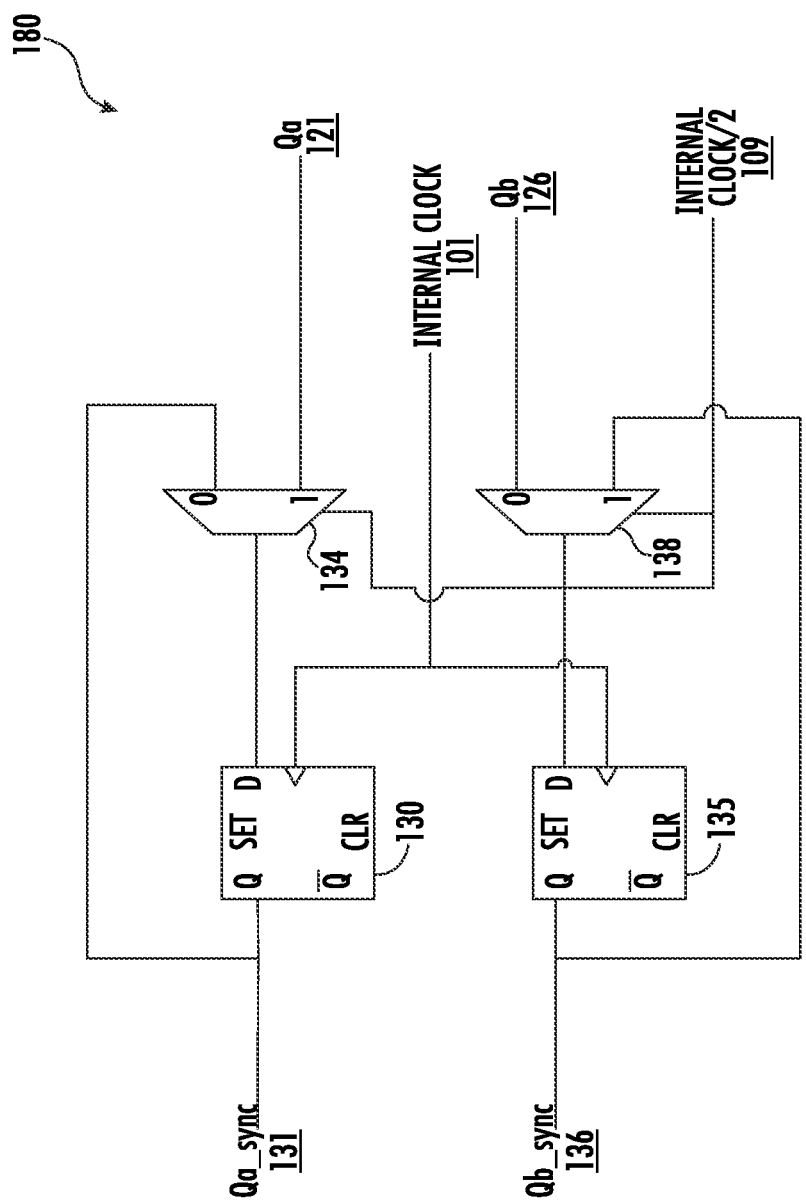

In another embodiment, the Internal Clock signal 101 is in communication with the clock inputs of the two synchronization flip flops 130, 135. In this embodiment, which is shown in FIG. 6B, the Internal Clock/2 signal 109 is used to select which of two inputs of a multiplexer 134, 138 is in communication with the D input of each of the two synchronization flip flops 130, 135. These two inputs may be the output of the respective flip flop and the output from the return data capture stage 170. In other words, the output of multiplexer 134 is in communication with the D input of the synchronization flip flop 130. The inputs to the multiplexer 134 are the Qa_sync signal 131 and the Qa signal 121. Similarly, the output of multiplexer 138 is in communication with the D input of the synchronization flip flop 135. The inputs to the multiplexer 138 are the Qb_sync signal 136 and the Qb signal 126. In this embodiment, the clock input of each synchronization flip flop 130, 135 is asserted at a frequency equal to that of the Internal Clock signal 101, but the incoming data is updated at a frequency equal to that of the Internal Clock/2 signal 109.

In this way, the output of the synchronization flip flop 130 (i.e. the Qa_sync signal 131) updates each time the Internal Clock signal 101 is asserted while the Internal Clock/2 signal 109 is asserted. The output of the synchronization flip flop 135 (i.e. the Qb_sync signal 136) updates each time the Internal Clock signal 101 is asserted while the Internal Clock/2 signal 109 is deasserted. In this way, data from the return data capture stage 170 is alternatively captured by the two synchronization flip flops 130, 135.

Referring again to FIG. 3, the Qa_sync signal 131 and the Qb_sync signal 136 are then used as the inputs to a multiplexer 140. The output of the multiplexer 140, referred to as the Q_Combo signal 141, is selected by the Internal Clock/2 signal 109.

The Q_Combo signal 141 serves as the input to the final data capture stage, which comprises a final flip flop 150. The internal clock signal 101 is used as the clock input to the final flip flop 150, while the Q_Combo signal 141 serves as the input. The output of the final data capture stage is referred to as the Q_Mux signal 151.

This Q_Mux signal 151 can then be an input to other circuitry disposed within the semiconductor device 1. The Q_Mux signal 151 may be used as part of synchronous logic, wherein the synchronous logic incorporates the deterministic delay of the data delay compensation circuit.

Thus, in one embodiment, the circuit to synchronously receive data comprises three stages, a return data capture stage 170, a return data synchronization stage 180 and a final capture stage. Further, unlike conventional circuits, the first two stages each comprise a plurality of flip flops. The return data capture stage 170 is clocked using the return clock signal 104, while the return data synchronization stage 180 is clocked using the internal clock signal 101.

Figure 4A:
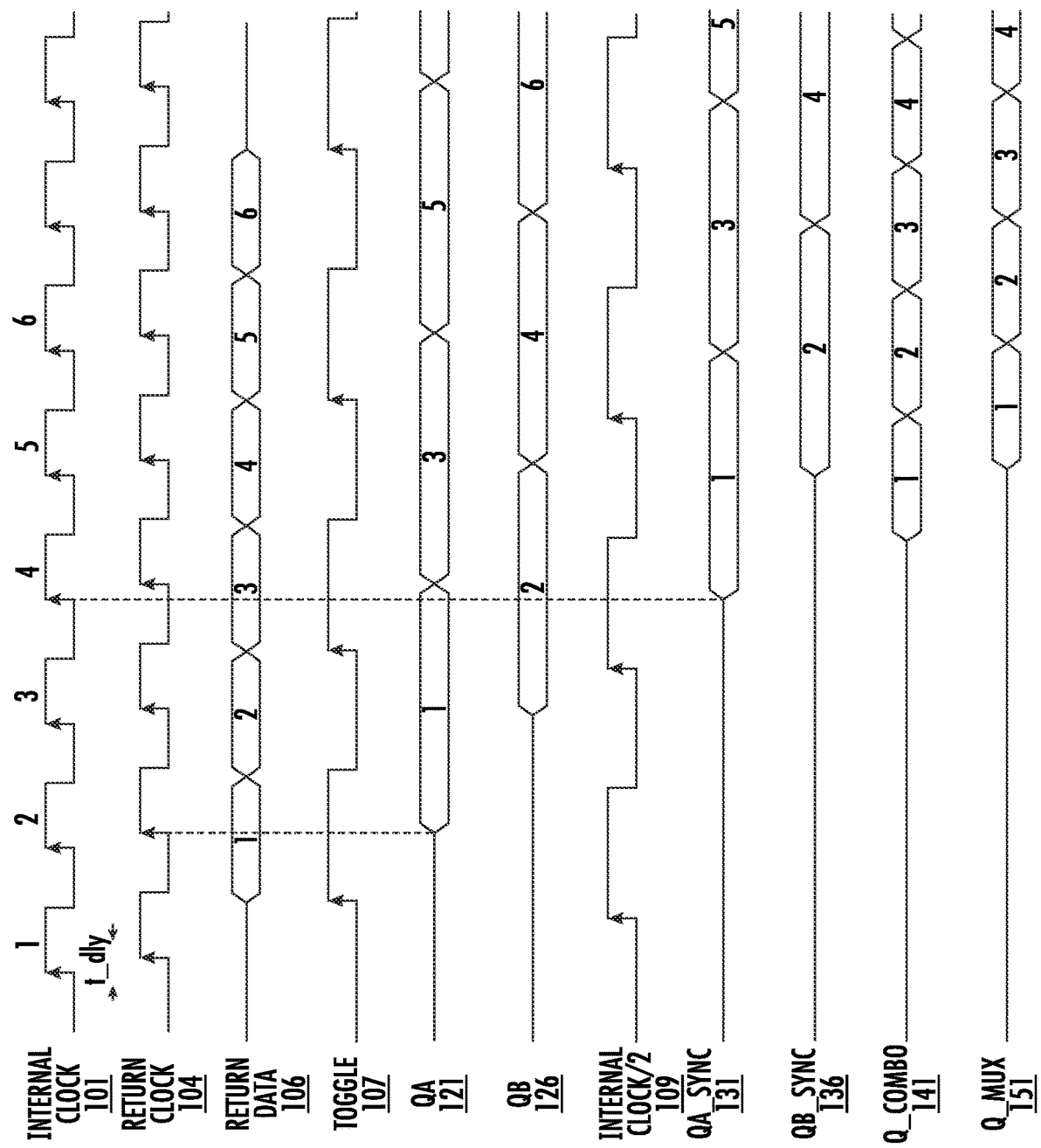
FIGS. 4A-4B are timing diagrams associated with the circuit of FIG. 3 for different I/O delays.
Figure 4B:
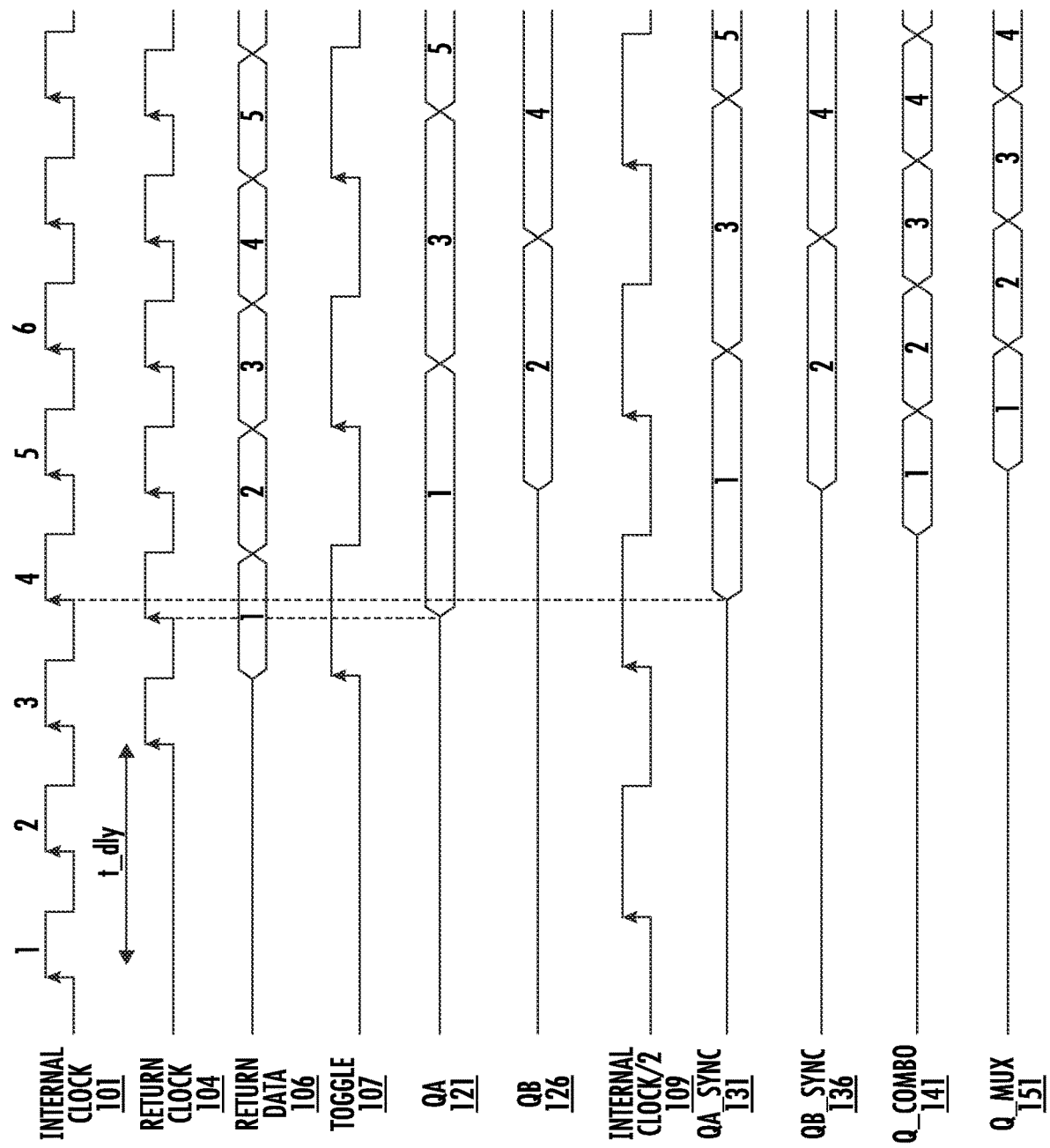

FIG. 4A-4B show timing diagrams associated with the circuit of FIG. 3, where each assumes a different I/O delay.

In FIG. 4A, the I/O delay is assumed to be small, such as less than one clock period, or less than one half of a clock period.

As described above, the internal clock signal 101 passes through clock I/O buffer 103 and the external clock is then passed back into the semiconductor device 1 to create the return clock signal 104. As stated above, the delay between the internal clock signal 101 and the return clock signal 104 is small in this example. Further, the return data 106 is generated based on the falling edge of the return clock signal 104, so that it is synchronous with respect to the return clock signal 104.

Additionally, the divide-by-two circuit 110 is used to create the internal clock/2 signal 109. The divide-by-two circuit 108 is used to create the toggle signal 107. As described above, the same edge of the internal clock signal 101 that caused the internal clock/2 signal 109 to be asserted also indirectly caused the toggle signal 107 to the asserted. Since the same edge of the internal clock signal 101 caused both signals to be asserted, these two signals (the internal clock/2 signal 109 and the toggle signal 107), are said to be in phase.

The toggle signal 107 is used to determine which of capture flip flops 120, 125 receives updated data during each clock of the return clock signal 104. In this embodiment, the capture flip flop 120 receives updated return data 106 when the toggle signal 107 is asserted, and the capture flip flop 125 receives updated return data 106 when the toggle signal 107 is deasserted. Thus, in this example, the Qa signal 121 is updated on the second, fourth, sixth, etc. pulse of the return clock signal 104. The Qb signal 126 is updated on the third, fifth, seventh, etc. pulse of the return clock signal 104.

Similarly, the synchronization flip flop 130 receives the updated Qa signal 121 when the internal clock/2 signal 109 is asserted. Thus, in this example, the Qa_sync signal 131 is updated on the fourth, sixth, eighth, etc. pulse of the internal clock/2 signal 104. The Qb_sync signal 136 is updated on the fifth, seventh, ninth, etc. pulse of the internal clock/2 signal 109.

In other words, in this embodiment, the internal clock signal 101 and the return clock signal 104 are partitioned into repeating sequences of two clock pulses. The even numbered pulses are used by the flip flops 120, 130, while the odd numbered pulses are used by the flip flops 125, 135.

The Qa_sync signal 131 and the Qb_sync signal 136 are provided as inputs to multiplexer 140, which selects one of these signals based on the state of the internal clock/2 signal 109. Thus, when the internal clock/2 signal 109 is deasserted, the Qa_sync signal 131 is passed by the multiplexer 140. When the internal clock/2 signal 109 is asserted, the Qb_sync signal 136 is passed by the multiplexer 140.

Finally, the Q_Combo signal 141 is clocked by each pulse of the internal clock signal 101. Note that the delay from the first pulse of the internal clock signal 101 (which indirectly resulted in the first return data 106) to the pulse at which the first return data 106 appears at the Q_Mux signal 151 is 4 clock periods.

FIG. 4B shows a similar timing diagram. However, in this example, the I/O delay is nearly 2 clock periods.

The relationship between the return clock signal 104, the return data 106, the toggle signal 107, the Qa signal 121 and the Qb signal 126 is the same as described above. However, because the IO delay is much larger than shown in FIG. 4A, the Qa signal 121 and the Qb signal 126 appear much later.

As described above, the synchronization flip flop 130 updates when the internal clock/2 signal 109 is asserted. Thus, at the fourth pulse of the internal clock signal 101, the Qa_sync signal 131 is updated with the first return data 106. At the fifth pulse of the internal clock signal 101, the Qb_sync signal 136 is updated with the second return data 106. The Qa_sync signal 131 and the Qb_sync signal 136 are provided as inputs to multiplexer 140, which selects one of these signals based on the state of the internal clock/2 signal 109. Thus, when the internal clock/2 signal 109 is deasserted, the Qa_sync signal 131 is passed by the multiplexer 140. When the internal clock/2 signal 109 is asserted, the Qb_sync signal 136 is passed by the multiplexer 140.

Finally, the Q_Combo signal 141 is clocked by each pulse of the internal clock signal 101. Note that the delay from the first pulse of the internal clock signal 101 (which indirectly resulted in the first return data 106) to the pulse at which the first return data 106 appears at the Q_Mux signal 151 is 4 clock periods.

In other words, the output of the final flip flop 150 always lags the internal clock signal 101 that caused the return data 106 by exactly 4 clock pulses. This is true for I/O delays from nearly 0 to nearly two clock periods.

It is noted that the circuit shown in FIG. 3 partitions the internal clock signal 101 into a repeating sequence of clock pulses, wherein one of the flip flops in the return data synchronization stage 180 always receives data associated with the same clock edge in the sequence. For example, in FIG. 3, the internal clock signal 101 is partitioned into a repeating sequence of two clock pulses, where the synchronization flip flop 130 receives updated data every even numbered clock pulse and synchronization flip flop 135 receives updated data every odd numbered clock pulse.

Likewise, the return clock signal 104 is partitioned into a repeating sequence, wherein one of the capture flip flops in the return data capture stage 170 always receives data associated with the same clock edge in the sequence. For example, in FIG. 3, the return clock signal 104 is partitioned into a repeating sequence of two clock pulses, where capture flip flop 120 receives updated data every even numbered clock pulse and the capture flip flop 125 receives updated data every odd numbered clock pulse.

However, the disclosure is not limited to the embodiment shown in FIG. 3. For example, the maximum allowable I/O delay may be increased if the internal clock signal 101 and the return clock signal 104 are partitioned into a repeating sequence of more than two clock pulses.

For example, the maximum allowable I/O delay may be increased to N clock cycles if the return data capture stage and the return data synchronization stage each comprise N flip flops, where N is greater than 1. This is shown in FIGS. 5A-5B.

Figure 5A:
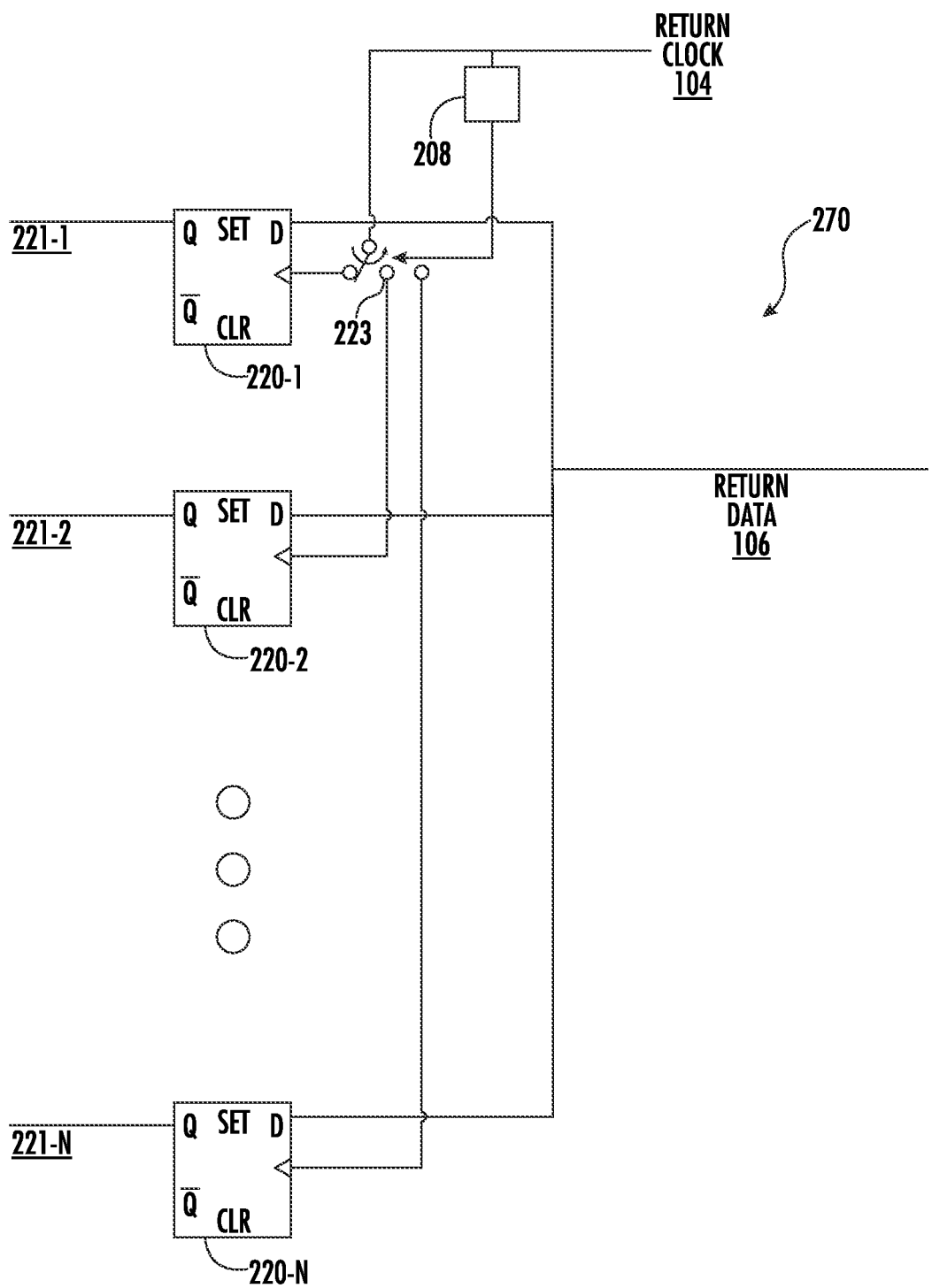
FIG. 5A-5B show a circuit for receiving synchronous signals according to another embodiment.

In other words, rather than two capture flip flops 120, 125 in the return data capture stage, the return data capture stage 270 comprises N capture flip flops, 220-1 through 220-N, as shown in FIG. 5A. Further, the divide-by-two circuit 108 of FIG. 3 is replaced with a selector that provides an indication of which of the N pulses in the repeating sequence is currently being captured. For example, the divide-by-two circuit 108 may be replaced with a capture selector circuit 208. The capture selector circuit 208 may be a counter that repeatedly counts from 0 to N−1. Alternatively, a N bit shift register, where exactly one bit is asserted at a time may be used. Of course, the capture selector circuit 208 may be implemented in other ways. The output of the capture selector circuit 208 is one or more signals that uniquely identify the capture flip flop 220-1 through 220-N that is updated during the next clock.

The output of this capture selector circuit 208 can then be used with demultiplexer 223 to route the return clock signal 104 to only one of the capture flip flops 220-1 through 220-N in the return data capture stage 270. Alternatively, the input to each of the capture flip flops 220-1 through 220-N may be the output of a multiplexer, which selects either the return data 106 or the current output of the respective capture flip flop, based on the value from the capture selector circuit 208. This configuration is similar to that shown in FIG. 6A, where there are additional capture flip flops and the multiplexer may have additional inputs. All of the inputs to the multiplexer, except one, are connected to the output of the respective capture flip flop. Thus, the capture selector circuit 208 allows the multiplexer to select between the return data 106 and the current output of the respective capture flip flop. The outputs 221-1 through 221-N of the return data capture stage 270 are supplied as inputs to the return data synchronization stage 280.

Figure 5B:
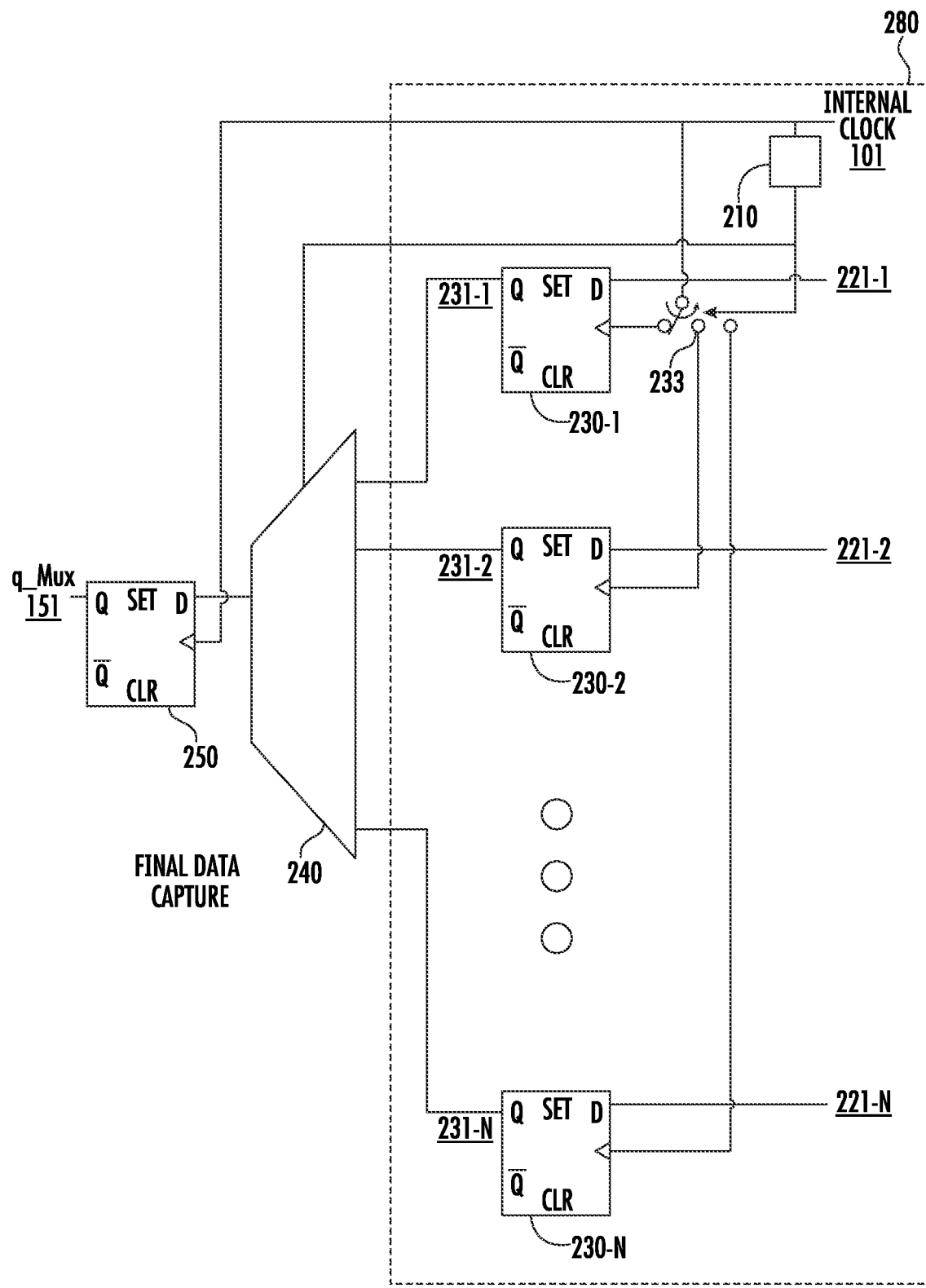

Likewise, as shown in FIG. 5B, the return data synchronization stage 280 comprises N synchronization flip flops, 230-1 through 230-N. Additionally, the divide-by-two circuit 110 may be replaced with a synchronization selector circuit that provides an indication of which of the N pulses in the repeating sequence is currently being synchronized. For example, the divide-by-two circuit 110 may be replaced with a synchronization selector circuit 210 that repeatedly counts from 0 to N−1. Alternatively, a N bit shift register, where exactly one bit is asserted at a time may be used. Of course, the synchronization selector circuit 210 may be implemented in other ways. The output of the synchronization selector circuit 210 is one or more signals that uniquely identify the synchronization flip flop 230-1 through 230-N that is updated during the next clock.

The output of this synchronization selector circuit 210 may be used with demultiplexer 233 to select only one of the N synchronization flip flops 230-1 through 230-N in the return data synchronization stage 280. Alternatively, similar to the configuration shown in FIG. 6B, the input to each of the synchronization flip flops 230-1 through 230-N may be the output of a multiplexer, which selects between the output of the corresponding synchronization flip flop in the return data synchronization stage 280 or the current output of the respective capture flip flop, based on the value from the synchronization selector circuit 210.

The multiplexer 240 receives the signals from the synchronization selector circuit 210 to select the one of the synchronization outputs 231-1 through 231-N from the synchronization flip flops 230-1 through 230-N. The output from the multiplexer 240 is used as the input to the final flip flop 250. The output of the final flip flop 250 is the Q mux signal 151.

In this way, the delay from the initial internal clock signal 101 to the first valid return data may be made arbitrarily long (i.e. N+2 clock period delay), but is always predictable as long as the I/O delay is less than N clock periods.

Other embodiments are also possible. For example, the present system may also be used in dual data rate (DDR) mode. In this mode, the internal clock signal 101 is divided by two prior to the clock I/O buffer 103. This results in an external CLOCK signal that is half of the frequency of the internal clock signal 101. As described above, the external device 2 receives data from the data out I/O buffer 102 and transmits data to the semiconductor device 1 via the data in I/O buffer 105. The external device 2 receives and transmits data on the rising edge and the falling edge of the CLOCK signal. The internal signal received from the clock I/O buffer 103 will also be half the frequency of the internal clock signal 101. Thus, a frequency multiplier receives the internal output from the clock I/O buffer 103 to generate the return clock signal 104 (shown in FIG. 3) so that the return clock signal 104 is the same frequency as the internal clock signal 101. The remainder of the circuit is as described above.

Figure 7:
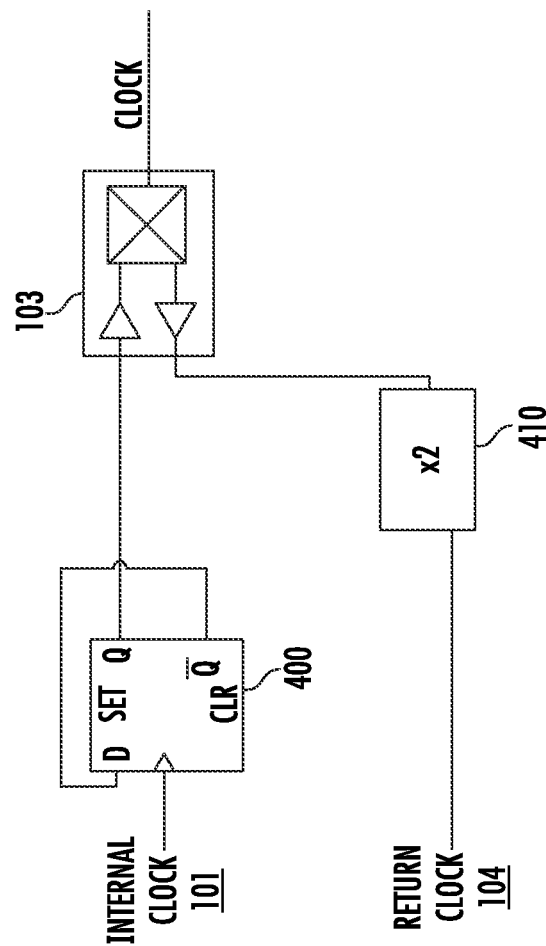
FIG. 7 shows a clock I/O buffer circuit for operation in dual data rate mode.

Thus, in this embodiment, the clock I/O buffer circuit, shown in FIG. 7, comprises the clock I/O buffer 103 and also comprises a divide-by-two circuit 400 to divide the internal clock signal 101 by two prior to transmission external to the semiconductor device 1. The clock I/O buffer circuit also comprises a multiply-by-two circuit 410 to multiply the internal output from the clock I/O buffer 103 by two so as to create the return clock signal 104.

In contrast, in the embodiments shown above in FIGS. 3 and 5A-5B, the clock I/O buffer circuit comprises the clock I/O buffer 103 but does not include divide or multiply circuits.

The present system and method have many advantages. First, this system allows the possibility of utilizing a slow I/O interface in a high speed communication system. This creates much less interference for other sensitive modules, such as radio circuits. In this way, a circuit designer can optimize for radio communications without adversely affecting other operations of the semiconductor device 1. Additionally, this system allows the use of a slower external device with a high speed interface while maintaining synchronous communications. As shown in FIG. 3 and FIGS. 5A-5B, the use of a plurality of flip flops in the return data capture stage and the return data synchronization stage allow for longer I/O delays while maintaining predictable operation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A data delay compensation circuit for use within a semiconductor device, comprising:
   an I/O buffer to provide return data from an external device to an interior of the semiconductor device;
   a clock I/O buffer circuit to supply an internal clock signal to an exterior of the semiconductor device and provide a return clock signal to the interior of the semiconductor device;
   a return data capture stage, comprising:
      a plurality of capture flip flops which are clocked using the return clock signal, wherein the plurality is N, wherein each capture flip flop receives updated return data every Nth clock;
   a return data synchronization stage, comprising:
      N synchronization flip flops which are clocked using the internal clock signal, wherein each synchronization flip flop receives updated data from a corresponding capture flip flop every Nth clock;
   a multiplexer to select an output from one of the N synchronization flip flops; and
   a final flip flop, which is clocked using the internal clock signal and receives the output from the multiplexer as an input.

2. The data delay compensation circuit of claim 1, wherein the return data capture stage comprises a capture selector circuit to uniquely select one of the N capture flip flops, wherein the capture selector circuit is clocked by the return clock signal.

3. The data delay compensation circuit of claim 2, wherein the capture selector circuit comprises a counter.

4. The data delay compensation circuit of claim 2, wherein the capture selector circuit comprises a shift register.

5. The data delay compensation circuit of claim 2, wherein the return data capture stage comprises a demultiplexer, having an input, a plurality of outputs and one or more select signals, wherein the input to the demultiplexer comprises the return clock signal, the select signals comprise an output of the capture selector circuit and each output is in communication with a clock input of a respective capture flip flop.

6. The data delay compensation circuit of claim 2, wherein the return data capture stage comprises N multiplexers, an output of each in communication with an input of a respective capture flip flop, wherein each of the N multiplexers selects between the return data and an output of the respective capture flip flop.

7. The data delay compensation circuit of claim 1, wherein the return data synchronization stage comprises a synchronization selector circuit to uniquely select one of the N synchronization flip flops, wherein the synchronization selector circuit is clocked by the internal clock signal.

8. The data delay compensation circuit of claim 7, wherein the synchronization selector circuit comprises a counter or a shift register.

9. The data delay compensation circuit of claim 7, wherein the return data synchronization stage comprises a demultiplexer, having an input, a plurality of outputs and one or more select signals, wherein the input to the demultiplexer comprises the internal clock signal, the select signals comprise an output of the synchronization selector circuit and each output is in communication with a clock input of a respective synchronization flip flop.

10. The data delay compensation circuit of claim 7, wherein the return data capture stage comprises N multiplexers, an output of each in communication with an input of a respective synchronization flip flop, wherein each of the N multiplexers selects between an output from the corresponding capture flip flop and an output of the respective synchronization flip flop.

11. The data delay compensation circuit of claim 1, wherein a difference in time between the internal clock signal and the return clock signal is defined as an I/O delay, and wherein a time from a first pulse of the internal clock signal to a time at which an output from the final flip flop is valid is deterministic if the I/O delay is less than N clock periods.

12. The data delay compensation circuit of claim 1, wherein the semiconductor device operates in dual data rate mode, and wherein the clock I/O buffer circuit comprises a clock I/O buffer, a divide-by-two circuit to divide the internal clock signal by two prior to transmission by the clock I/O buffer, and a multiply-by-two circuit to multiply an internal output from the clock I/O buffer by two to create the return clock signal.

13. A data delay compensation circuit for use within a semiconductor device, comprising:
an I/O buffer to provide return data from an external device to an interior of the semiconductor device;
a clock I/O buffer circuit to supply an internal clock signal to an exterior of the semiconductor device and provide a return clock signal to the interior of the semiconductor device;
a return data capture stage, comprising:
a capture divide-by-two circuit clocked using the return clock signal to create a toggle signal;
a first capture flip flop and a second capture flip flop, which are clocked using the return clock signal, wherein each capture flip flop receives updated return data every other clock, based on a state of the toggle signal;
a return data synchronization stage, comprising:
a synchronization divide-by-two circuit clocked using the internal clock signal to create an internal clock/2 signal;
a first synchronization flip flop and a second synchronization flip flop, which are clocked using the internal clock signal, wherein the first synchronization flip flop receives updated data from the first capture flip flop every other clock and wherein the second synchronization flip flop receives updated data from the second capture flip flop every other clock, based on a state of the internal clock/2 signal;
a multiplexer to select an output from one of the first synchronization flip flop and the second synchronization flip flop based on the state of the internal clock/2 signal; and
a final flip flop, which is clocked using the internal clock signal and receives the output from the multiplexer as an input.

14. The data delay compensation circuit of claim 13, wherein the return data capture stage comprises a demultiplexer, having an input, a select signal and two outputs, wherein the input to the demultiplexer is the return clock signal, the select signal is the toggle signal and a first of the two outputs is in communication with a clock signal of the first capture flip flop and a second of the two outputs is in communication with a clock signal of the second capture flip flop.

15. The data delay compensation circuit of claim 13, wherein the return data synchronization stage comprises a demultiplexer, having an input, a select signal and two outputs, wherein the input to the demultiplexer is the internal clock signal, the select signal is the internal clock/2 signal and a first of the two outputs is in communication with a clock signal of the first synchronization flip flop and a second of the two outputs is in communication with a clock signal of the second synchronization flip flop.

16. The data delay compensation circuit of claim 13, wherein the return data capture stage comprises a first multiplexer, having two inputs, a select signal and an output, wherein the two inputs to the multiplexer comprise the return data and an output of the first capture flip flop, the select signal is the toggle signal and the output is in communication with an input of the first capture flip flop; and a second multiplexer, having two inputs, a select signal and an output, wherein the two inputs to the multiplexer comprise the return data and an output of the second capture flip flop, the select signal is the toggle signal and the output is in communication with an input of the second capture flip flop.

17. The data delay compensation circuit of claim 13, wherein the return data synchronization stage comprises a first multiplexer, having two inputs, a select signal and an output, wherein the two inputs to the multiplexer comprise the output of the first capture flip flop and an output of the first synchronization flip flop, the select signal is the internal clock/2 signal and the output is in communication with an input of the first synchronization flip flop; and a second multiplexer, having two inputs, a select signal and an output, wherein the two inputs to the multiplexer comprise an output of the second capture flip flop and an output of the second synchronization flip flop, the select signal is the internal clock/2 signal and the output is in communication with an input of the second synchronization flip flop.

18. The data delay compensation circuit of claim 13, wherein a difference in time between the internal clock signal and the return clock signal is defined as an I/O delay, and wherein a time from a first pulse of the internal clock signal to a time at which an output from the final flip flop is valid is deterministic if the I/O delay is less than 2 clock periods.

19. The data delay compensation circuit of claim 18, wherein the return clock signal is generated based on the internal clock signal, the return data is generated based on an edge of the return clock signal, and a delay from an assertion of the internal clock signal to receipt of valid data at the output of the final flip flop is 4 clock periods.

20. The data delay compensation circuit of claim 13, wherein the semiconductor device operates in dual data rate mode, and wherein the clock I/O buffer circuit comprises a clock I/O buffer, a divide-by-two circuit to divide the internal clock signal by two prior to transmission by the clock I/O buffer, and a multiply-by-two circuit to multiply an internal output from the clock I/O buffer by two to create the return clock signal.

* * * * *